United States Patent
Zhao

(10) Patent No.: US 10,804,154 B2
(45) Date of Patent: Oct. 13, 2020

(54) WAFER PROCESSING METHOD

(71) Applicant: DISCO CORPORATION, Tokyo (JP)

(72) Inventor: Jinyan Zhao, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/289,969

(22) Filed: Mar. 1, 2019

(65) Prior Publication Data

US 2019/0279903 A1    Sep. 12, 2019

(30) Foreign Application Priority Data

Mar. 6, 2018 (JP) .................................. 2018-039413

(51) Int. Cl.
*H01L 21/78* (2006.01)
*H01L 21/67* (2006.01)
*H01L 21/683* (2006.01)

(52) U.S. Cl.
CPC ........ *H01L 21/78* (2013.01); *H01L 21/67092* (2013.01); *H01L 21/67115* (2013.01); *H01L 21/67132* (2013.01); *H01L 21/6836* (2013.01); *H01L 2221/68318* (2013.01); *H01L 2221/68327* (2013.01)

(58) Field of Classification Search
CPC .............. H01L 21/78; H01L 21/67115; H01L 21/67132; H01L 2221/6836; H01L 2221/68336

See application file for complete search history.

(56) References Cited

U.S. PATENT DOCUMENTS

| 2015/0348821 A1* | 12/2015 | Iwanaga ................ H01L 24/27 257/798 |
| 2019/0103328 A1* | 4/2019 | Horibe .................... H01L 21/78 |

FOREIGN PATENT DOCUMENTS

JP    2002192370 A    7/2002

* cited by examiner

*Primary Examiner* — Marcos D. Pizarro
*Assistant Examiner* — Antonio B Crite
(74) *Attorney, Agent, or Firm* — Greer Burns & Crain Ltd.

(57) ABSTRACT

A wafer processing method includes a grouping step of dividing a wafer along division lines demarcating a plurality of devices as one block on the wafer to form a plurality of group pieces, a reattaching step of attaching one of the group pieces to an expansion tape, a modified layer forming step of emitting a laser beam having a wavelength transmittable through the wafer along the division lines for each group piece to form modified layers, a dividing step of expanding the expansion tape, and dividing each of the group pieces in which the modified layers are formed into individual devices.

5 Claims, 6 Drawing Sheets

WAFER PROCESSING METHOD

BACKGROUND OF THE INVENTION

Field of the Invention

The present invention relates to a wafer processing method of dividing a wafer into individual chips.

Description of the Related Art

In recent years, as a method of dividing a plate-shaped wafer such as a semiconductor wafer, there has been attempted a laser processing method of irradiating the wafer with a pulsed laser beam of a wavelength transmittable through the wafer with a focal point of the pulsed laser beam focused in a region to be divided inside the wafer. In the dividing method in which this laser processing method is used, one surface side of a wafer is irradiated with a pulsed laser beam of a wavelength transmittable through the wafer with a focal point of the pulsed laser beam focused inside the wafer, and as a result of this irradiation, modified layers (altered layers) are continuously formed inside the wafer along a plurality of division lines. Then, the modified layers continuously formed reduce strength of the division lines, and an external force is applied to the wafer along the division lines, thereby dividing the wafer (Japanese Patent No. 3408805).

In the dividing method described above, there has been known a method in which, after a wafer with modified layers formed therein is attached to an expansion tape, an external force is applied to the wafer by expanding the expansion tape. This method enables division of the wafer along the division lines all together.

SUMMARY OF THE INVENTION

However, in a case in which the wafer is divided as described above, when a chip size is small (with 1 mm or less on a side, for example), a portion where division has not been performed sufficiently among the division lines may be generated.

It is therefore an object of the present invention to provide a wafer processing method capable of favorably dividing a wafer into individual chips even if the chip size is made small.

In accordance with an aspect of the present invention, there is provided a wafer processing method of dividing a wafer into individual devices along a plurality of division lines, the wafer having the individual devices formed in a plurality of regions demarcated by the plurality of division lines formed in a grid pattern on a front surface of the wafer. The wafer processing method includes a grouping step of dividing the wafer along the division lines demarcating a plurality of the devices as one block to form a plurality of group pieces, a reattaching step of reattaching one of the group pieces or some of the group pieces which are spaced apart from each other to an expansion tape, a modified layer forming step of, after the reattaching step is performed, emitting a laser beam having a wavelength transmittable through the wafer along the division lines for each group piece to form modified layers, and a dividing step of, after the modified layer forming step is performed, expanding the expansion tape to divide the group piece in which the modified layers are formed into the individual devices.

In accordance with another aspect of the present invention, there is provided a wafer processing method of dividing a wafer into individual devices along a plurality of division lines, the wafer having the individual devices formed in a plurality of regions demarcated by the plurality of division lines formed in a grid pattern on a front surface of the wafer. The wafer processing method includes an expansion tape attaching step of attaching the wafer to an expansion tape, a grouping step of emitting a laser beam having a wavelength transmittable through the wafer along the division lines demarcating a plurality of the devices as one block to form modified layers, and expanding the expansion tape to thereby divide the wafer into a plurality of group pieces, a modified layer forming step of emitting a laser beam having a wavelength transmittable through the wafer along the division lines for each group piece to form modified layers, and a dividing step of, after the modified layer forming step is performed, further expanding the expansion tape than in the grouping step to divide each of the plurality of group pieces into individual devices.

In the wafer processing methods according to the aspect and another aspect of the present invention, the wafer is divided and grouped into the plurality of group pieces each of which has the plurality of devices. Moreover, the group piece may be reattached to another expansion tape, or some of the group pieces may be attached to the expansion tape. Accordingly, when a group piece is divided into individual devices by expanding an expansion tape, the group piece which is attached to the expansion tape may be set to one, or a plurality of group pieces may be spaced apart from one another at an appropriate distance, so that a force caused by expansion can be applied to each group piece. As a result of this, even when a chip size is small, it is possible to favorably perform division by expanding the expansion tape. In other words, since a force by expanding is applied to the group pieces formed by grouping the wafer, it is possible to favorably divide the wafer into individual chips even when the chip size is small.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Figure 1:
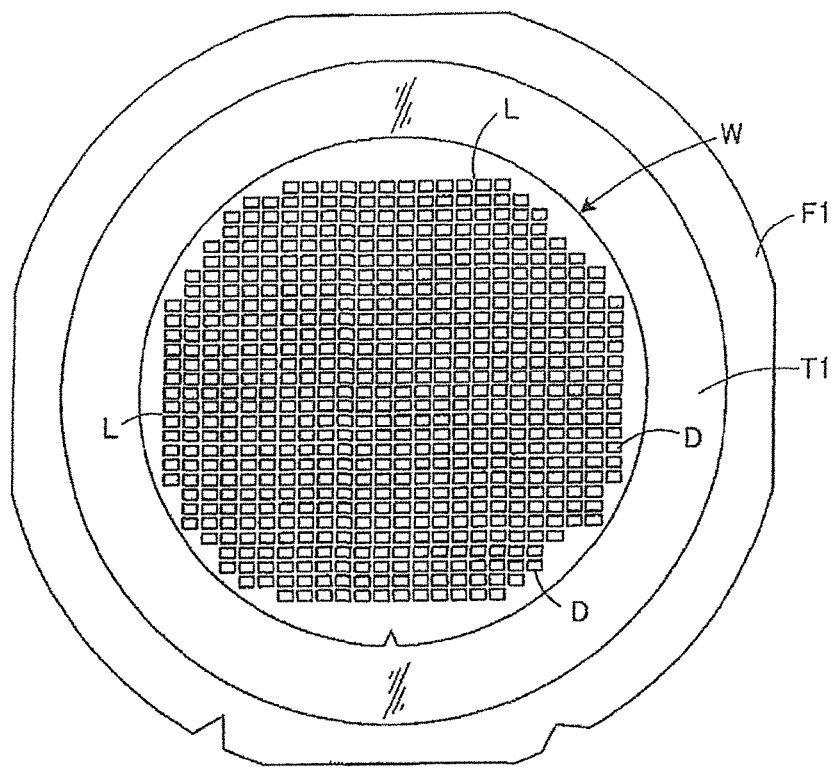
FIG. 1 is a schematic plan view of a wafer.

A wafer processing method in each of first and second embodiments will be described below with reference to the attached drawings. First, referring to FIG. 1, a description will be given of a wafer to be processed by the wafer processing method in each of the embodiments. FIG. 1 is a schematic plan view of a wafer.

As illustrated in FIG. 1, a wafer W is formed into a substantially disc shape. The wafer W has a plurality of division lines L in a grid pattern arranged on a front surface thereof, and individual devices D are formed in a plurality of regions demarcated by the division lines L. FIG. 1 illustrates a state in which the wafer W is attached to an upper surface of an expansion tape T1 which is mounted to an annular frame F1 such that the wafer W is held on the frame F1 though the expansion tape T1.

After the wafer W is subjected to stealth dicing (SD) and a modified layer is formed therein, the expansion tape T1 is expanded to divide the wafer W into individual devices D along the division lines L. As the wafer W to be processed, various kinds of wafers such as a semiconductor substrate or an inorganic material substrate may be used. As examples of the semiconductor substrate, the semiconductor substrates composed of various kinds of semiconductor materials such as silicon, gallium arsenide, gallium nitride, or silicon carbide may be used. As examples of the inorganic material substrate, the inorganic material substrates composed of various kinds of inorganic materials such as sapphire, ceramic, or glass may be used. Also, as the wafer W, the wafers composed of lithium tantalate, lithium niobate or raw ceramic may be used. The devices such as piezoelectric elements may be formed on the wafers.

First Embodiment

Figure 5:
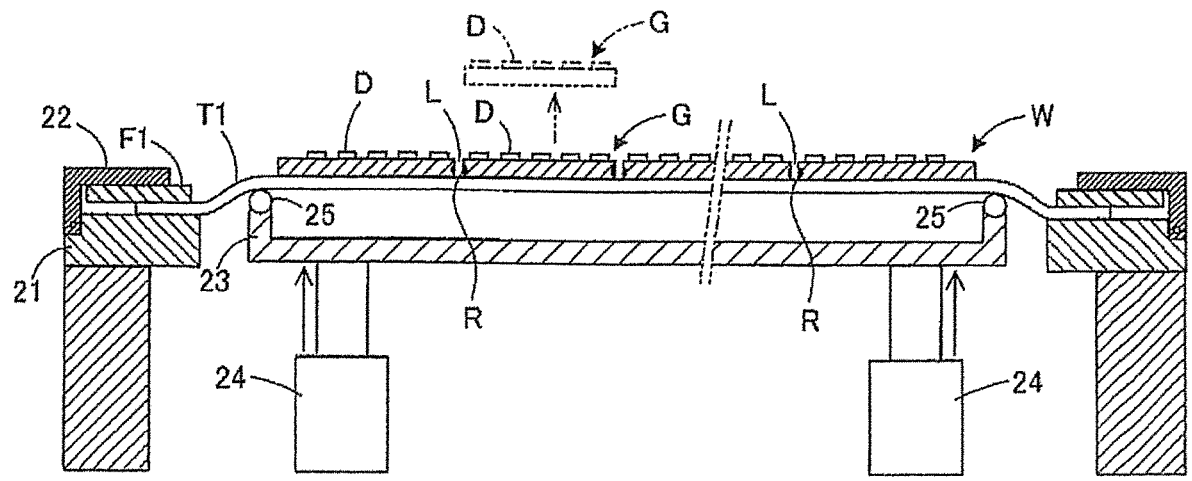
FIG. 5 is an explanatory view illustrating a dividing step for grouping in the grouping step.
Figure 6:
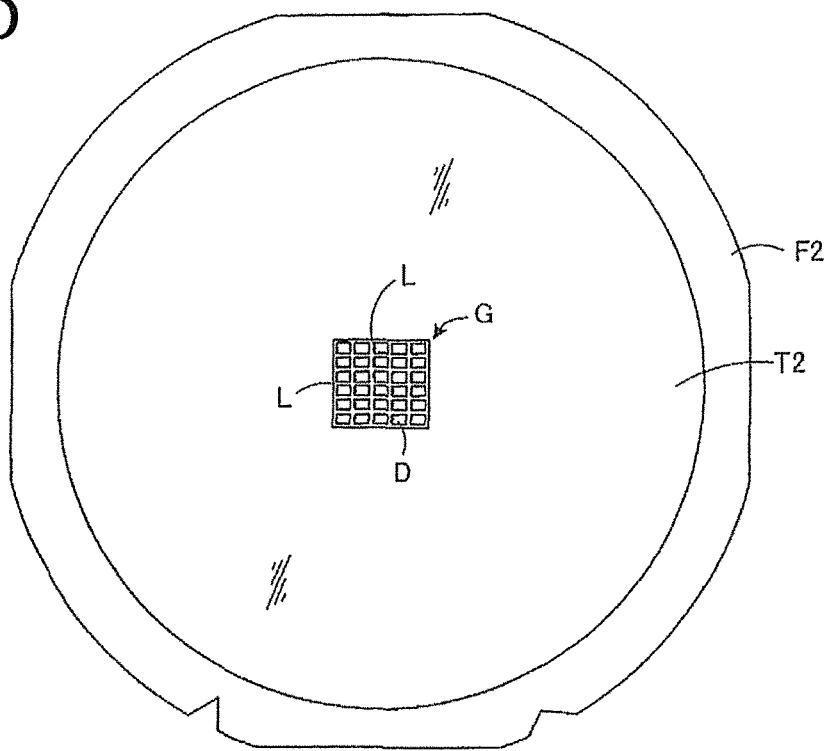
FIG. 6 is an explanatory view illustrating a reattaching step.
Figure 7:
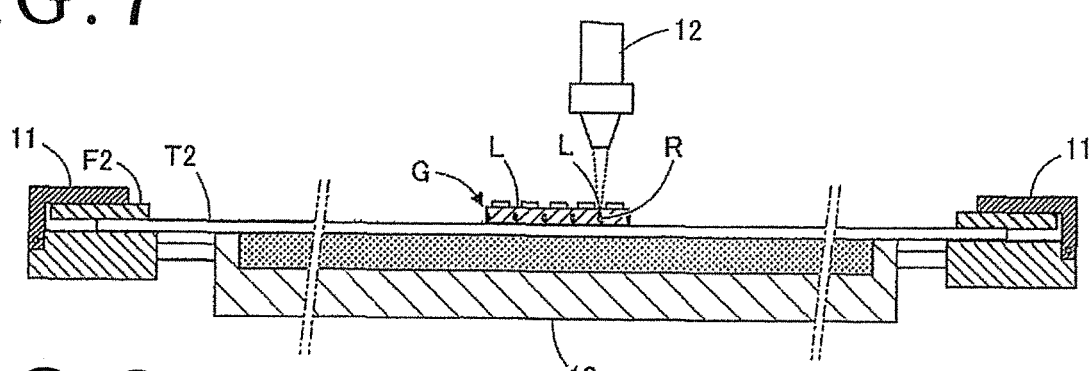
FIG. 7 is an explanatory view illustrating a modified layer forming step.
Figure 8:
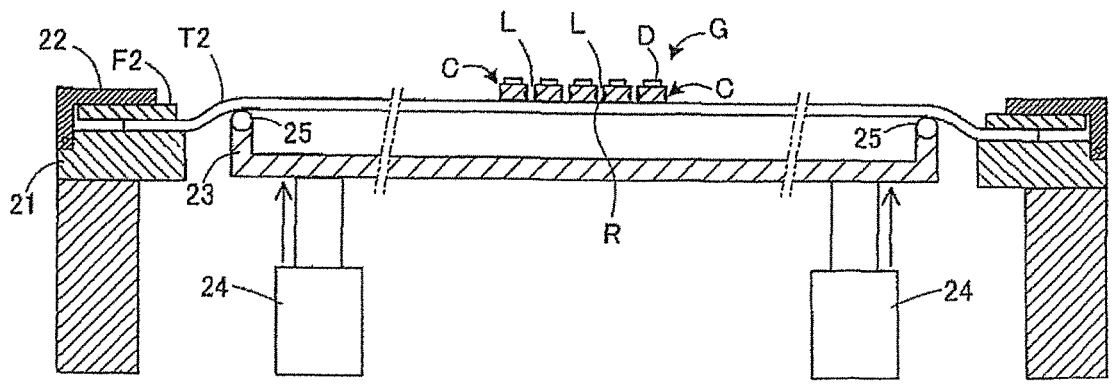
FIG. 8 is an explanatory view illustrating a dividing step.
Figure 9:
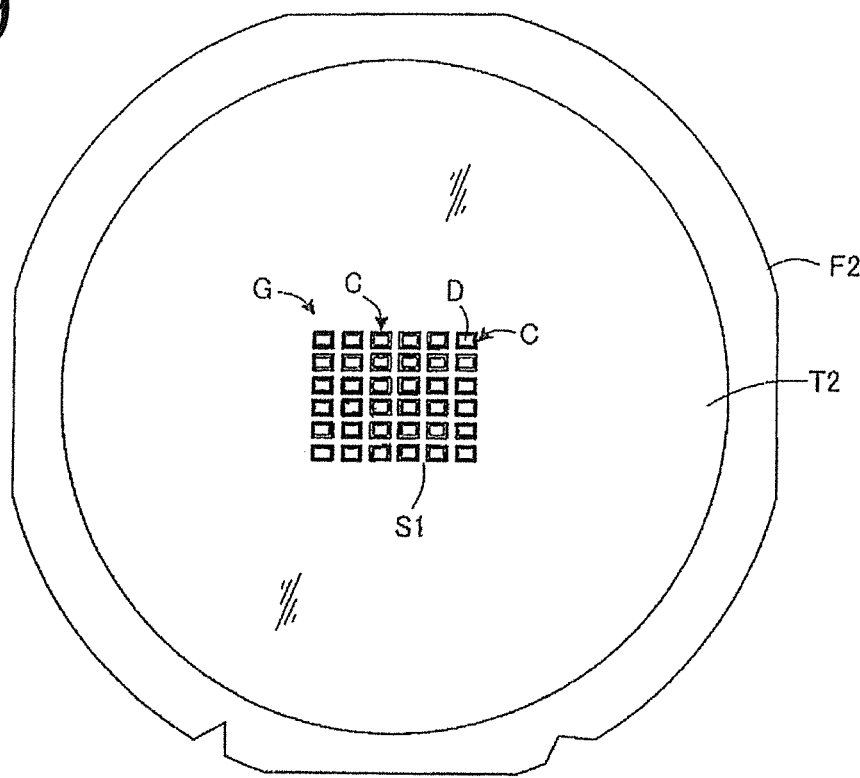
FIG. 9 is an explanatory view illustrating the dividing step.

Next, referring to FIGS. 2 to 9, a description will be given of a wafer processing method of the first embodiment. FIGS. 2 to 5 are explanatory views illustrating a grouping step. FIG. 6 is an explanatory view illustrating a reattaching step. FIG. 7 is an explanatory view illustrating a modified layer forming step. FIGS. 8 and 9 are explanatory views illustrating a dividing step.

In the first embodiment, first, the grouping step of forming a group piece G (see FIG. 4) from the wafer W is performed. In the grouping step, an attaching step for grouping illustrated in FIG. 2, a modified layer forming step for grouping illustrated in FIGS. 3 ad 4, a dividing step for grouping illustrated in FIG. 5 are performed.

Figure 2:
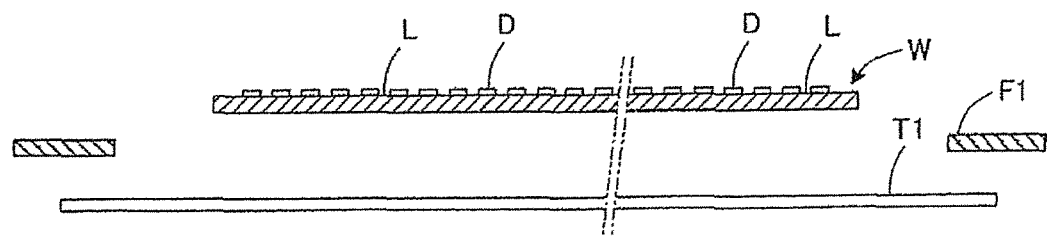
FIG. 2 is an explanatory view illustrating an attaching step for grouping in a grouping step according to a first embodiment.

As illustrated in FIG. 2, in the attaching step for grouping, after the wafer W is disposed inside the annular frame F1, the expansion tape T1 is attached to a back surface (lower surface) side of the wafer W and a lower side of the frame F to be integrated. As a result, the wafer W becomes a state of being mounted to the frame F1 through the expansion tape T1 (see FIG. 1).

Figure 3:
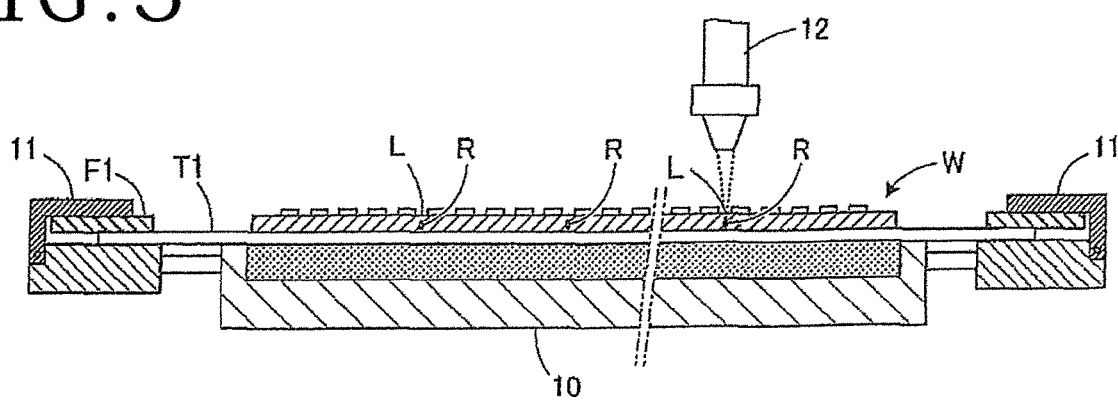
FIG. 3 is an explanatory view illustrating a modified layer forming step for grouping in the grouping step.
Figure 4:
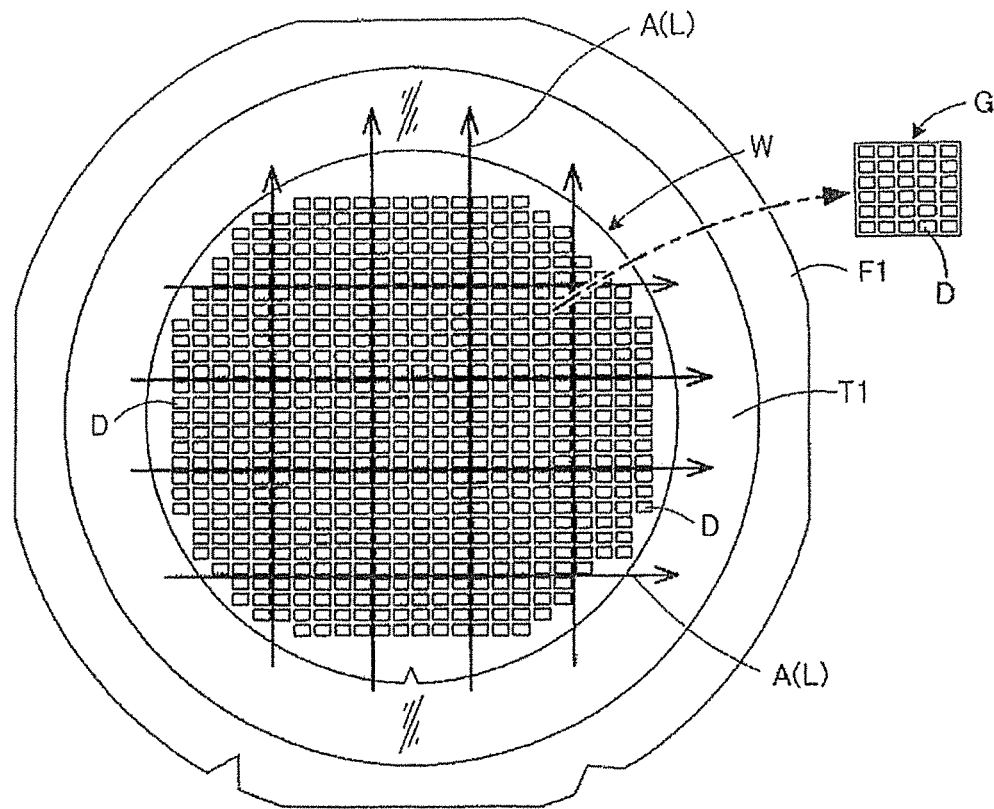
FIG. 4 is an explanatory view illustrating the modified layer forming step for grouping in the grouping step.

After the attaching step for grouping is performed, as illustrated in FIG. 3, the modified layer forming step for grouping is performed. In the modified layer forming step for grouping, first, the wafer W is held under suction through the expansion tape T1 on a holding table 10 of a laser processing apparatus (not illustrated), and the frame F1 around the wafer W is clamped with clamp portions 11 to be held.

Next, a laser beam emission port of a processing head 12 is positioned directly above one of the division lines L of the wafer W, and a laser beam is emitted to the wafer W from the processing head 12. The laser beam has a wavelength transmittable through the wafer W and is adjusted such that a focal point of the laser beam is positioned inside the wafer W. While being adjusted in this manner, the processing head 12 is relatively moved with respect to the wafer W, and as a result, modified layers R along the division lines L are formed inside the wafer W.

In the modified layer forming step for grouping herein, the modified layers R are not formed along all of the division lines L of the wafer W, but are formed along some of the division lines L. More particularly, as illustrated with arrow lines A in FIG. 4, the modified layers R (see FIG. 3) are formed along the division lines L positioned at intervals of a plurality of devices D arranged in up and down directions and right and left directions in FIG. 4. The adjacent arrow lines A demarcate the plurality of devices D arranged in the up and down directions and the right and left directions on the wafer W into one block, and the modified layers R are formed along the division lines L positioned on outer edge sides of the block.

After the modified layer forming step for grouping is performed, as illustrated in FIG. 5, the dividing step for grouping is performed. In the dividing step for grouping, the frame F1 is held on an annular table 21 of an expanding apparatus (not illustrated) with clamp portions 22, and an upper end of an expanding drum 23 is positioned between the wafer W and the frame F1. At this time, the expanding drum 23 is larger in diameter than the wafer W, and an outer peripheral edge of the expanding drum 23 comes in contact with a lower surface side of the expansion tape T1 between the wafer W and the frame F1. The expanding drum 23 is supported by a plurality of cylinders 24 so as to be movable upward and downward, and a plurality of rolling contact rollers 25 are provided at the upper end of the expanding drum 23. Driving the cylinders 24 relatively moves the expanding drum 23 upward toward the annular table 21 so as to thrust up the expansion tape T1. As a result of thrusting up the expansion tape T1, the expansion tape T1 is expanded in a radial direction, and the wafer W is divided along the division lines L along which the modified layers R are formed, with the modified layers R whose strength is reduced as starting points of division. As a result, the wafer W is divided for each block including the plurality of devices D demarcated in the modified layer forming step for grouping, and the blocks thus divided are formed as individual group pieces G (see FIG. 4).

After the grouping step is performed, the reattaching step is performed. In the reattaching step, as illustrated with a two-dot chain line in FIG. 5, one group piece G of the plurality of group pieces G formed is picked up with a picker (not illustrated) or the like. Then, as illustrated in FIG. 6, the one group piece G thus picked up is transferred and disposed inside an annular frame F2, and another expansion tape T2 different from the expansion tape T1 described above is attached to a back surface (lower surface) side of the one group piece G and a lower surface side of the frame F2 to be integrated. Thus, the one group piece G is reattached from the expansion tape T1 in FIG. 4 to the expansion tape T2 illustrated in FIG. 6 different from the expansion tape T1.

The reattaching step is conducted in the manner described above such that all or some of a plurality of group pieces G are reattached one by one to one sheet of expansion tape T2 to form a plurality of sets, each set having the group pieces G mounted to the frame F2 through the expansion tape T2.

After the reattaching step is performed, as illustrated in FIG. 7, a modified layer forming step is performed. In the modified layer forming step, compared to the modified layer forming step for grouping described above, a target to form the modified layer R is changed from the wafer W to the group piece G, and an irradiation position of the laser beam is changed. Note that, in the following description, the same laser processing apparatus is used in both the modified layer forming step for grouping and the modified layer forming step; however, a different laser processing apparatus may be used in each of these steps.

In the modified layer forming step, first, the group piece G is held under suction on the holding table 10 of the laser processing apparatus (not illustrated) through the expansion tape T2, and the frame F2 in the periphery of the group piece G is clamped with the clamp portions 11 to be held. Next, the laser beam emission port of the processing head 12 is positioned directly above one of the division lines L of the group piece G, and the laser beam is emitted to the group piece G from the processing head 12. The laser beam has a wavelength transmittable through the group piece G (wafer W) and is adjusted such that the focal point of the laser beam is positioned inside the group piece G. While being adjusted in this manner, the processing head 12 is relatively moved relative to the group piece G, thereby forming the modified layer R along the division line L inside the group piece G. In the modified layer forming step, the modified layers R are formed along all the division lines L on the group piece G.

In the modified layer forming step, after the modified layers R are formed relative to one group piece G in the manner described above, the modified layers R are also formed relative to the other group pieces G in the same manner as needed, and the modified layers R are formed for each group piece G.

After the modified layer forming step is performed, as illustrated in FIG. 8, a dividing step is performed. In the dividing step, compared to the dividing step for grouping described above, a target to divide is changed from the wafer W to the group piece G. Note that, in the following description, the same expanding apparatus is used in both the dividing step for grouping and the dividing step; however, a different expanding apparatus may be used in each of these steps.

In the dividing step, the frame F2 is held on the annular table 21 of the expanding apparatus (not illustrated) with the clamp portions 22, and the upper end of the expanding drum 23 is positioned between the group piece G and the frame F2. At this time, the outer peripheral edge of the expanding drum 23 comes in contact with a lower surface side of the expansion tape T2 between the group piece G and the frame F2. Then, the cylinders 24 is driven to relatively move the expanding drum 23 upward toward the annular table 21 so as to thrust up the expansion tape T2. As a result of thrusting up the expansion tape T2, the expansion tape T2 is expanded in a radial direction. Accordingly, the modified layers R whose strength is reduced are set as starting points of division, and the group piece G is divided along the division lines L along which the modified layers R are formed. Then, as illustrated in FIG. 9, each chip C is formed corresponding to each of the devices D. In this group piece G, a gap S1 is formed between the adjacent chips C, so that the chip C can be picked up with a picker (not illustrated).

In the dividing step, after one group piece G is divided in the manner as described above, the other group pieces G are also divided in the same manner as needed, and division into individual chips C is performed by expanding the expansion tape T2 for each group piece G.

As described above, according to the processing method of the first embodiment, the wafer W is divided into the group pieces G described above, and then, one of the group pieces G is reattached to the expansion tape T2 to perform the expansion of the expansion tape T2. Thus, compared to a case in which the expansion is performed in a state in which the modified layers R are formed along all the division lines L on the wafer W, it is possible to increase a tensile force applied to each of the division lines L. As a result, even if a size of the chip C is small and the number of division lines L is increased in the wafer W, dividing by expansion can be favorably performed.

Second Embodiment

Next, a description will be given of a wafer processing method in the second embodiment. In the second embodiment, an expansion tape attaching step, a grouping step, a modified layer forming step, and a dividing step are performed in this order. Note that, in the second embodiment, a configuration similar to that of the wafer processing method in the first embodiment will be simplified for description.

In the expansion tape attaching step in the second embodiment, the method similar to the attaching step for grouping in the first embodiment illustrated in FIG. 2 is performed, and a state in which the wafer W is mounted to the frame F1 through the expansion tape T1 (see FIG. 1) is adopted in this step.

Figure 10:
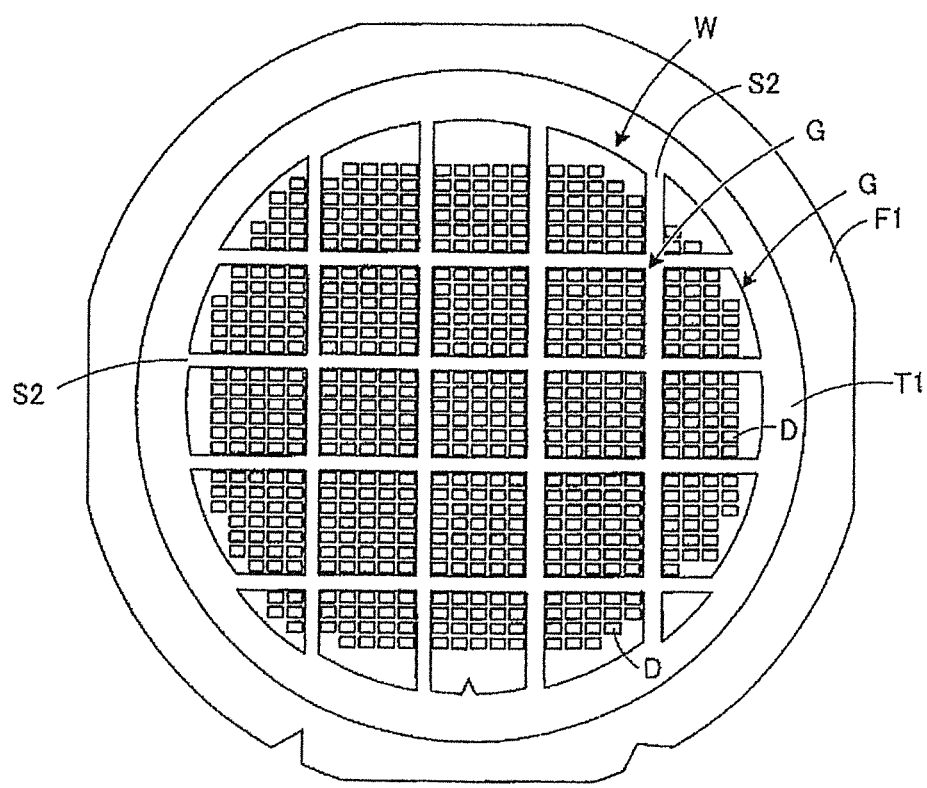
FIG. 10 is an explanatory view illustrating a grouping step according to a second embodiment.

In the grouping step in the second embodiment, after the expansion tape attaching step is performed, first, the methods similar to the modified layer forming step for grouping (see FIGS. 3 and 4) and the dividing step for grouping (see FIG. 5) in the first embodiment are performed. In this case, when the wafer W is divided into a plurality of group pieces G by expanding the expansion tape T1, a gap S2 is formed such that the adjacent group pieces G are spaced apart from each other at an appropriate distance as illustrated in FIG. 10.

Figure 11:
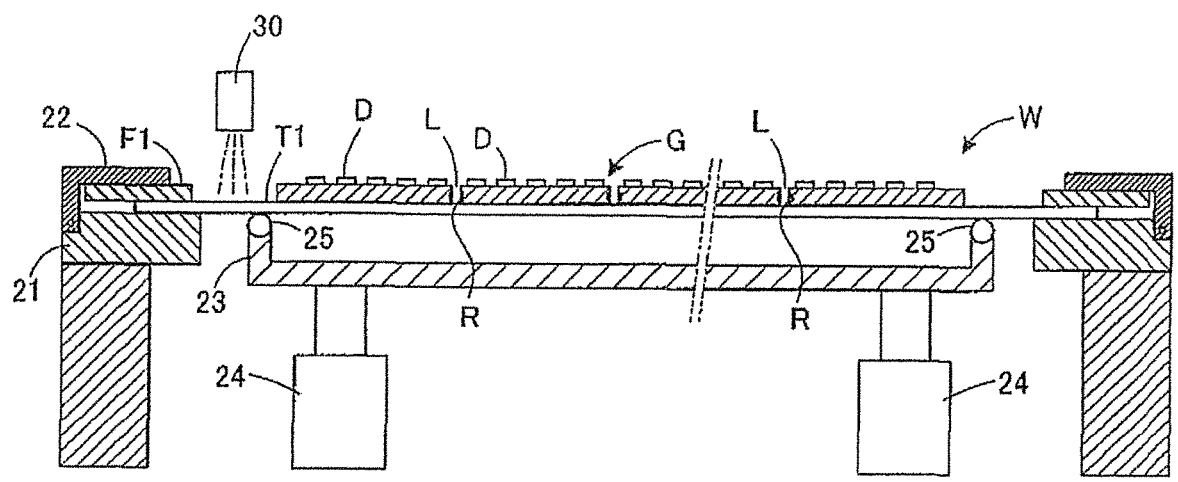
FIG. 11 is an explanatory view illustrating the grouping step according to the second embodiment.

After the wafer W is divided into the individual group pieces G, the reattaching step is performed in the first embodiment; however, in the second embodiment, the grouping step is performed to remove a slack of the expansion tape T1 as illustrated in FIG. 11.

More specifically, a slack occurs in the expansion tape T1 due to loosening of a tension of the expansion tape T1 between an outer periphery of the wafer W and an inner periphery of the frame F1. Accordingly, the slacked portion of the expansion tape T1 is heat-shrunk with a heater 30 which is positioned above the wafer W to remove the slack. The heater 30 is rotated with a center of the wafer W as an axis for rotation, performing spot irradiation of the slacked portion of the expansion tape T1 with a far-infrared ray, so that a region between the outer periphery of the wafer W and the inner periphery of the frame F1 is heated. As a result of this heating, the expansion tape T1 on a side of the outer periphery of the wafer W is intensively heated, so that the expansion tape T1 is shrunk over the whole circumference thereof, thereby removing the slack in the expansion tape T1. Note that, in the second embodiment, the expansion tape T1 is formed of a material having an expanding property as well as developing a shrinking property due to heating at a predetermined temperature or more.

In the modified layer forming step in the second embodiment, compared to the modified layer forming step for grouping in the first embodiment (see FIG. 7), a target to form the modified layers R is changed to the plurality of group pieces G, and the laser beam is applied for each group piece G.

Figure 12:
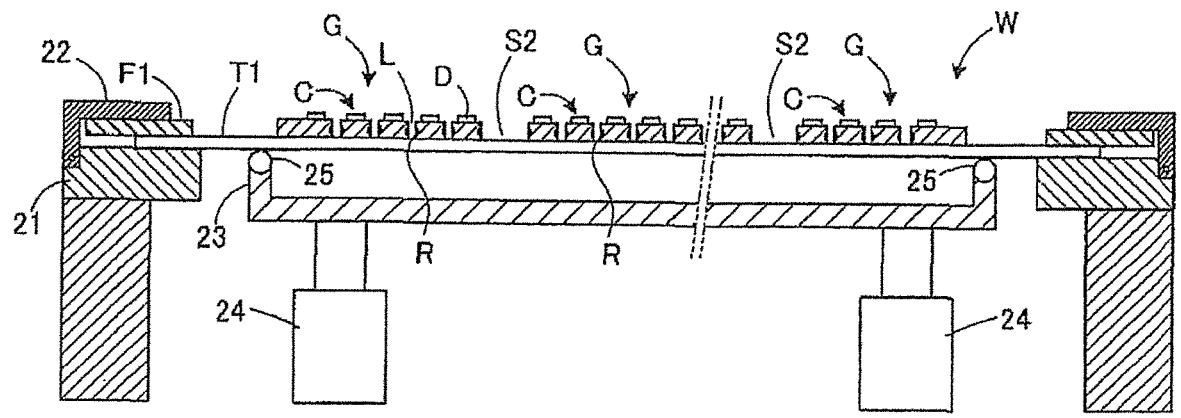
FIG. 12 is an explanatory view illustrating a dividing step according to the second embodiment.

In the dividing step in the second embodiment, compared to the dividing step in the first embodiment (see FIG. 8), the target to expand is changed to the expansion tape T1 which has been expanded in the grouping step. Accordingly, in the dividing step, the expansion tape T1 is further expanded than in the grouping step, and as illustrated in FIG. 12, each chip C corresponding to the device D is formed in each of the group pieces G attached to the expansion tape T1.

As described above, according to the processing method of the second embodiment, by expanding the expansion tape T1 in both the grouping step and the dividing step, the wafer W is divided into the group pieces G, and the group pieces G thus obtained are then divided into individual chips C. Since division is performed in two stages by expanding the expansion tape T1 twice in this manner, it is possible to reduce the number of division lines L to be divided in each stage. Thus, compared to a case in which expansion is performed in a state in which the modified layers R are formed along all the division lines L on the wafer W, a tensile force applied to the division lines L can be increased in each of the two stages of dividing. Accordingly, in the second embodiment, it is possible to prevent occurrence of division defects in the whole wafer W and to favorably perform division by expanding in the case of a small chip size.

Note that, although there has been described a case in which the modified layers R are formed as starting points for division in the grouping step, this is not limitative. For example, half-cut dicing (groove forming processing) may be performed in which a laser processing groove or a cutting groove is formed by cutting the wafer W from the front surface of the wafer W to the middle of a thickness direction thereof to divide the wafer W into individual group pieces G by the expanding described above or breaking. Alternatively, the wafer W may be divided by full-cut dicing in which grooves passing through the wafer W in the thickness direction thereof are formed by laser processing or cutting processing with a cutting blade to thereby completely cut the wafer W.

Figure 13:
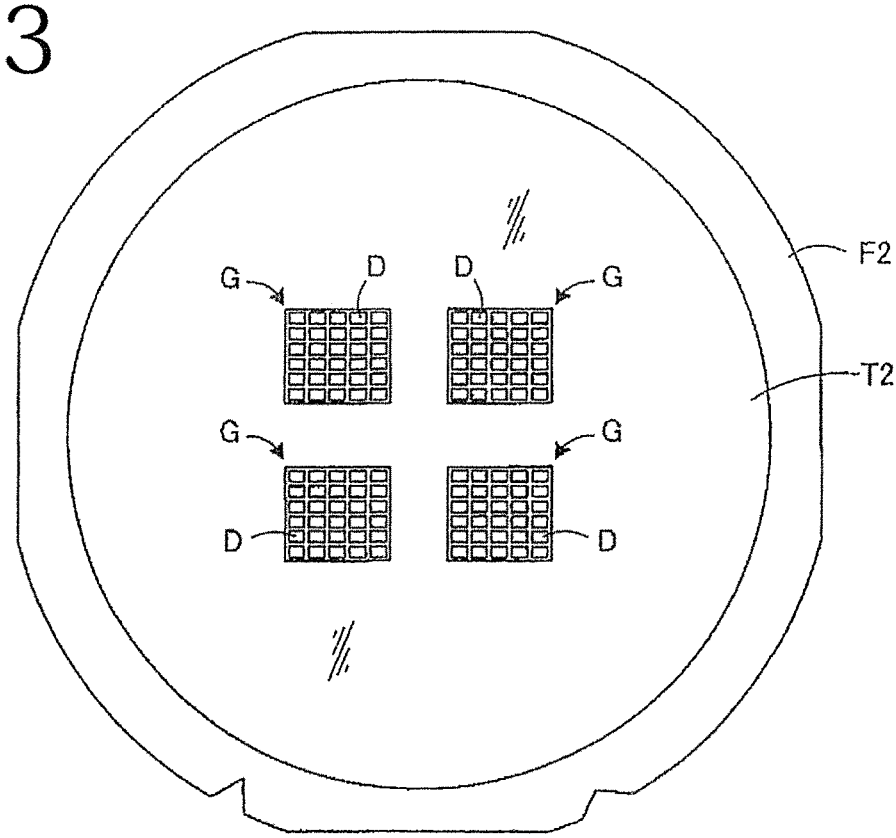
FIG. 13 is an explanatory view illustrating a reattaching step according to a modification example.
Figure 14:
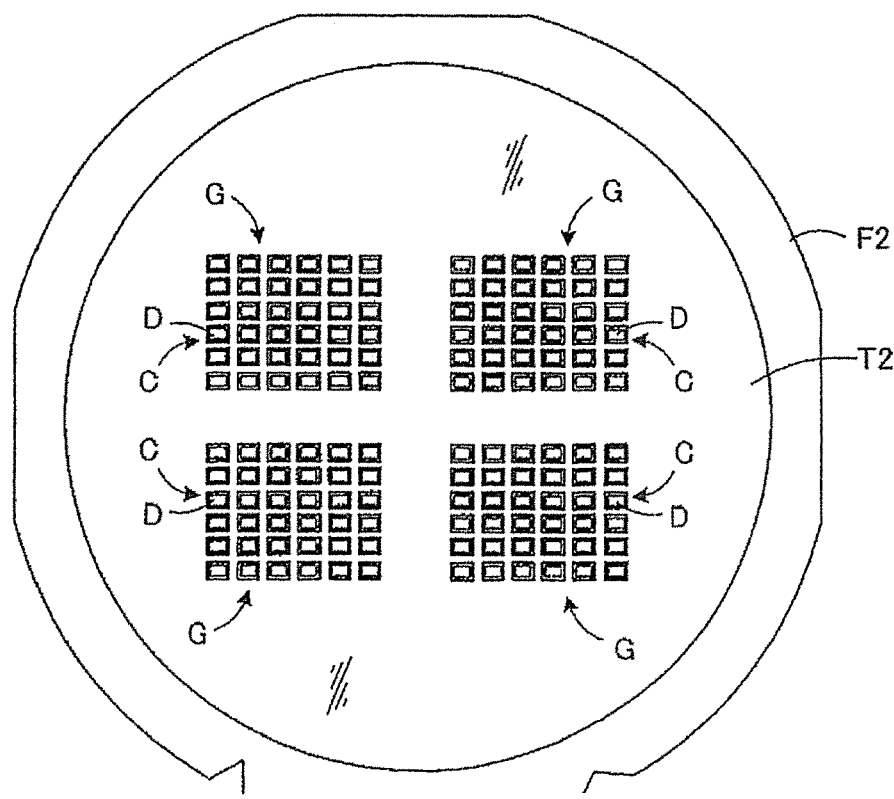
FIG. 14 is an explanatory view illustrating a dividing step according to the modification example.

Alternatively, in the reattaching step in the first embodiment, as illustrated in FIG. 13, it may be applicable that the number of group pieces G attached to the expansion tape T2 is two or more. In FIG. 13, four group pieces G are attached to be spaced apart from one another, and after the reattaching step is performed, the laser beam is applied for each group piece G to form the modified layers R. Subsequently, the expansion tape T2 is expanded in the manner similar to that described above, so that each of the group pieces G is divided along the division lines L to form the individual chips C as illustrated in FIG. 14. Even when a plurality of group pieces G are divided in this manner, it is possible to favorably divide the group pieces G in the case of the small chip size.

Although each of the embodiments and the modification example of the present invention have been described, as another embodiment of the present invention, the embodiments and the modification example described above may be entirely or partly used in combination.

In addition, embodiments of the present invention are not limited to each of the embodiments described above and may be changed, replaced, or altered in various ways without departing from the spirit of the technical idea of the present invention. Further, if the technical idea of the present invention can be realized in a different method as a result of development of technology or another derivative technology, the embodiments of the present invention can be implemented by use of the different method. Accordingly, the scope of claims covers all embodiments which may be included within the scope of the technical idea of the present invention.

As described above, the present invention has an effect of allowing the wafer to be favorably divided into individual chips and is particularly useful to a case in which the chip size is small.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method of dividing a wafer into individual devices along a plurality of division lines, the wafer having the individual devices formed in a plurality of regions demarcated by the plurality of division lines formed in a grid pattern on a front surface of the wafer, the wafer processing method comprising:

an attaching step of attaching the wafer on a first expansion tape;

a first modified layer forming step of emitting a first laser beam having a wavelength transmittable through the wafer along the division lines demarcating a plurality of the devices as one block, to form first modified layers;

a grouping step of dividing the wafer along the first modified layers to form a plurality of group pieces;

a reattaching step of reattaching one of the group pieces or some of the group pieces which are spaced apart from each other to a second expansion tape;

a second modified layer forming step of, after the reattaching step is performed, emitting a second laser beam having a wavelength transmittable through the wafer along the division lines for each group piece to form second modified layers; and a second dividing step of, after the second modified layer forming step is performed, expanding the expansion tape to divide the group piece in which the second modified layers are formed into the individual devices.

2. The wafer processing method as defined in claim 1, wherein the grouping step further comprises expanding the first expansion tape to divide the wafer into the plurality of group pieces.

3. The wafer processing method as defined in claim 1, wherein the second expansion tape is different from the first expansion tape.

4. A wafer processing method of dividing a wafer into individual devices along a plurality of division lines, the wafer having the individual devices formed in a plurality of regions demarcated by the plurality of division lines formed in a grid pattern on a front surface of the wafer, the wafer processing method comprising:

an expansion tape attaching step of attaching the wafer to an expansion tape;

a grouping step of emitting a first laser beam having a wavelength transmittable through the wafer along the division lines demarcating a plurality of the devices as one block to form first modified layers, and expanding the expansion tape to thereby divide the wafer into a plurality of group pieces;

a modified layer forming step of emitting a second laser beam having a wavelength transmittable through the wafer along the division lines for each group piece to form second modified layers; and a dividing step of, after the modified layer forming step is performed, further expanding the expansion tape than in the grouping step to divide each of the plurality of group pieces into individual devices.

5. The wafer processing method as defined in claim 4, further comprising, after the expanding of the expansion tape in the grouping step, a step of heating an outer periphery of the expansion tape to shrink the outer periphery.

* * * * *